United States Patent
Rossum

(10) Patent No.: US 11,087,732 B2
(45) Date of Patent: Aug. 10, 2021

(54) OSCILLATORY TIMBRES FOR MUSICAL SYNTHESIS THROUGH SYNCHRONOUS RING MODULATION

(71) Applicant: Rossum Electro-Music, LLC, Santa Cruz, CA (US)

(72) Inventor: David Rossum, Santa Cruz, CA (US)

(73) Assignee: Rossum Electro-Music, LLC, Santa Cruz, CA (US)

( * ) Notice: Subject to any disclaimer, the term of this patent is extended or adjusted under 35 U.S.C. 154(b) by 0 days.

(21) Appl. No.: 16/722,979

(22) Filed: Dec. 20, 2019

(65) Prior Publication Data

US 2020/0211520 A1    Jul. 2, 2020

Related U.S. Application Data

(60) Provisional application No. 62/784,963, filed on Dec. 26, 2018.

(51) Int. Cl.
  *G10H 5/00*  (2006.01)
  *G10H 5/02*  (2006.01)
  (Continued)

(52) U.S. Cl.
  CPC .............. *G10H 5/002* (2013.01); *G10H 1/06* (2013.01); *G10H 5/02* (2013.01); *H03L 7/00* (2013.01)

(58) Field of Classification Search
  CPC . G10H 5/002; G10H 1/06; G10H 5/02; H03L 7/00
  (Continued)

(56) References Cited

U.S. PATENT DOCUMENTS 3,268,831 A * 8/1966 Rosier .................. H03L 7/23
                                                  331/2
3,441,653 A * 4/1969 Clark, Jr. ............. G10H 1/00
                                                  84/698

(Continued)

OTHER PUBLICATIONS

AutomaticGainsay, The Korg Monologues—Part 8—Sync and Ring, Feb. 10, 2017, https://www.youtube.com/watch?v=HeBVFYZ6CII (Year: 2017).*

(Continued)

*Primary Examiner* — Christina M Schreiber
(74) *Attorney, Agent, or Firm* — Carr & Ferrell LLP

(57) ABSTRACT

Methods and systems for generating oscillatory timbres for musical synthesis through synchronous ring modulation are described. An example method performing hard synchronization comprising using first and second oscillators, the first oscillator being a fundamental oscillator which provides a fundamental frequency, the second oscillator being a modulation oscillator operable at a frequencies higher than the first oscillator; and in response to the fundamental oscillator completing its cycle, synchronizing the modulation oscillator to the original point of its waveform. Ring modulation may be performed on the synchronized output by multiplying it by a waveform of the fundamental oscillator, such that the ring modulation is synchronized to produce a variety of oscillatory timbres. The method can create a variety of unique sounds having musically pleasing characteristics. A real-time audio signal can be used instead of the first oscillator to produce dynamically varying timbres.

24 Claims, 7 Drawing Sheets

(51) Int. Cl.
*G10H 1/06* (2006.01)
*H03L 7/00* (2006.01)

(58) Field of Classification Search
USPC .......................................................... 84/672
See application file for complete search history.

(56) References Cited

U.S. PATENT DOCUMENTS

| | | | | |
|---|---|---|---|---|
| 3,941,930 | A * | 3/1976 | Mohri | H04L 7/041 |
| | | | | 348/525 |
| 4,179,969 | A * | 12/1979 | Hamada | G10H 1/182 |
| | | | | 84/672 |
| 4,180,707 | A | 12/1979 | Moog | |
| 4,250,496 | A * | 2/1981 | Southgate | G08B 3/10 |
| | | | | 340/384.71 |
| 4,314,496 | A * | 2/1982 | Beigel | G10H 5/002 |
| | | | | 84/703 |
| 4,316,401 | A * | 2/1982 | Tavel | G10H 1/057 |
| | | | | 84/648 |
| 4,322,995 | A * | 4/1982 | Tavel | G10H 1/057 |
| | | | | 84/700 |
| 4,447,792 | A * | 5/1984 | Wynn | H03C 3/0941 |
| | | | | 331/18 |
| 5,157,623 | A | 10/1992 | Hayashi | |
| 5,170,369 | A | 12/1992 | Rossum | |
| 5,414,210 | A * | 5/1995 | Sato | G10H 1/04 |
| | | | | 84/627 |
| 6,504,935 | B1 | 1/2003 | Jackson | |
| 6,664,460 | B1 | 12/2003 | Pennock et al. | |
| 7,638,704 | B2 * | 12/2009 | Ludwig | G06F 3/017 |
| | | | | 84/672 |
| 10,514,883 | B2 | 12/2019 | Rossum | |
| 2006/0145733 | A1 * | 7/2006 | Leary | G06F 3/05 |
| | | | | 327/105 |
| 2009/0164905 | A1 | 6/2009 | Ko | |
| 2018/0239578 | A1 | 8/2018 | Rossum | |
| 2020/0211520 | A1 * | 7/2020 | Rossum | G10H 5/02 |

OTHER PUBLICATIONS

Trillian manual, 2020, Ring Modulation, https://support.spectrasonics.net/manual/Trilian/1.5/en/topic/ring-modulation (Year: 2020).*
AutomaticGainsay, The Korg Monologues—Part 8—Sync and Ring, Feb. 10, 2017, https://www.youtube.com/watch?v=HeBVFYZ6CII&t=1s (Year: 2017).*
Massie, Dana, "Coefficient Interpolation for the Max Mathews Phasor Filter," (AES Convention Papers, 113rd Convention, 2012), 8 pages.
Rossum, Dave, "The 'ARMAdillo' Coefficient Encoding Scheme for Digital Audio Filters", IEEE ASSP Workshop on Application of Signal Processing to Audio and Acoustics, Oct. 1991, 2 pages.
Rossum, Dave, "Making digital filters sound 'analog'", International Computer Music Association, vol. 1992, 1992, pp. 30-33.
Chowning, John, "The Synthesis of Complex Audio Spectra by Means of Frequency Modulation," Journal of the Audio Engineering Society, vol. 21, Issue 7; Sep. 1973.; pp. 526-534; available at: <https://web.eecs.umich.edu/~fessler/course/100/misc/chowning-73-tso.pdf>.
Wikipedia: "Ring Modulation" [online], [retreived on Dec. 18, 2018], Retreived from the Internet: <https://en.wikipedia.org/wiki/Ring_modulation>, 8 pages.
Synthesizeracademy.com, "Ring Modulator" [online], [retreived on Dec. 18, 2018], Retreived from the Internet: <http://synthesizeracademy.com/ring-modulator/>, 5 pages.
Wikipedia: "Oscillator Sync" [online], [retreived on Dec. 18, 2018], Retreived from the Internet: <https://en.wikipedia.org/wiki/Oscillator_sync>, 3 pages.
Keith McMillan Instruments, "Simple Synthesis: Part 7, Oscillator Sync | Keith McMillen Instruments" posted by Emmett Corman [online], [retreived on Dec. 18, 2018], Retreived from the Internet: <https://www.keithmcmillen.com blog/simple-synthesis-part-7-oscillator-sync/>, 3 pages.
Brandt, Eli, "Hard Sync Without Aliasing",in Proceedings of International Computer Music Conference, Havana, Cuba, Oct. 26,2001, available at <https://www.cs.cmu.edu/~eli/papers/icmc01-hardsync.pdf>; pp. 365-368.
"Pitch Detection Methods," Multimedia Systems Department, Gdansk University of Technology, [online], [retreived on Dec. 18, 2018], Retreived from the Internet: <https://sound.eti.pg.gda.pl/student/eim/synteza/leszczyna/index_ang.htm>, 7 pages.
Wikipedia: "Waveshaper" [online], [retreived on Dec. 21, 2018], Retreived from the Internet: <https://en.wikipedia.org/wiki/Waveshaper>, 3 pages.
Wikibooks: "Sound Synthesis Theory/Oscillators and Wavetables" [online], [retreived on Dec. 21, 2018], Retreived from the Internet: <https://en.wikibooks.org/wiki/Sound_Synthesis_Theory/Oscillators_and_Wavetables>, 7 pages.
Curtis Electro-Music Specialties, "CEM3340/3345 Voltage Controlled Oscillator" Datasheet; [online], [retreived on Jan. 27, 2020], Retreived from the Internet: <https://nebula.wsimg.com/1c34939ca17fdcf07c8ceee4661ba253?AccessKeyld=E68C2B1C2930EF53D3A4>, 6 pages.

* cited by examiner

400

```
┌─────────────────────────────────────────────────────────────────────────┐
│  PERFORMING HARD SYNCHRONIZATION COMPRISING USING A FIRST               │
│  OSCILLATOR AND A SECOND OSCILLATOR, THE FIRST OSCILLATOR BEING A       │
│  FUNDAMENTAL OSCILLATOR WHICH PROVIDES A FUNDAMENTAL FREQUENCY;         │
│  THE SECOND OSCILLATOR BEING AN MODULATION OSCILLATOR THAT CAN BE       │
│  OPERATED AT FREQUENCIES HIGHER THAN THE FIRST OSCILLATOR               │
│                               405                                       │
└─────────────────────────────────────────────────────────────────────────┘
                                    │
                                    ▼
┌─────────────────────────────────────────────────────────────────────────┐
│  THE PERFORMING HARD SYNCHRONIZATION FURTHER COMPRISING, IN             │
│  RESPONSE TO THE FUNDAMENTAL OSCILLATOR COMPLETING ITS CYCLE,           │
│  SYNCHRONIZING THE MODULATION OSCILLATOR TO THE ORIGINAL POINT OF       │
│                          ITS WAVEFORM                                   │
│                               410                                       │
└─────────────────────────────────────────────────────────────────────────┘
                                    │
                                    ▼
┌─────────────────────────────────────────────────────────────────────────┐
│  PERFORMING RING MODULATION ON THE SYNCHRONIZED OUTPUT OF THE           │
│  MODULATION OSCILLATORY BY MULTIPLYING THE SYNCHRONIZED OUTPUT OF       │
│  THE MODULATION OSCILLATOR BY A WAVEFORM OF THE FUNDAMENTAL             │
│  OSCILLATOR, SUCH THAT THE RING MODULATION IS SYNCHRONIZED TO           │
│  PRODUCE A VARIETY OF OSCILLATORY TIMBRES                               │
│                               415                                       │
└─────────────────────────────────────────────────────────────────────────┘
```

RECEIVING AN INPUT SIGNAL HAVING A DEGREE OF DETECTABLE PERIODICITY
405A

CREATING A PULSE TRAIN THAT IS PERIODIC WITH PERIODIC ELEMENTS OF THE RECEIVED AUDIO SIGNAL
410A

USING THE PULSE TRAIN AS A HARD SYNCHRONIZATION INPUT TO A MODULATION OSCILLATOR TO PRODUCE A SYNCHRONIZED MODULATION OSCILLATOR OUTPUT
415A

PERFORMING RING MODULATION ON THE SYNCHRONIZED MODULATION OSCILLATOR OUTPUT BY MULTIPLYING THE SYNCHRONIZED MODULATION OSCILLATOR OUTPUT BY THE RECEIVED AUDIO SIGNAL, SUCH THAT THE RING MODULATION IS SYNCHRONIZED TO PRODUCE A PLURALITY OF DIFFERENT OSCILLATORY TIMBRES SUCH THAT UNIQUE SOUNDS HAVING MUSICALLY PLEASING CHARACTERISTICS ARE CREATED
420A

FIG. 4A

OSCILLATORY TIMBRES FOR MUSICAL SYNTHESIS THROUGH SYNCHRONOUS RING MODULATION

CROSS REFERENCE TO RELATED APPLICATION

This non-provisional patent application claims the benefit of U.S. provisional patent application No. 62/784,963, filed on Dec. 26, 2018, which is hereby incorporated by reference in its entirety.

TECHNICAL FIELD

The present technology relates generally to audio processing, and more particularly, but not by limitation, to generating oscillatory timbres for musical synthesis.

BACKGROUND

The approaches described in this section could be pursued but are not necessarily approaches that have previously been conceived or pursued. Therefore, unless otherwise indicated, it should not be assumed that any approaches described in this section qualify as prior art merely by virtue of their inclusion in this section.

Electronic music is often created using "subtractive synthesis" in which a complex oscillatory waveform is processed, often by a time varying filter, to produce musical sounds or notes of varying, interesting, pleasing and/or expressive timbre. Much of the art of electronic music lies in obtaining desirable, time varying, note timbres.

The source of complex oscillatory waveforms can be a voltage controlled oscillator providing a variety of output waveforms. Examples of commonly used waveforms are geometric and trigonometric shapes such as sinusoids, triangle, sawtooth and square waves. The palate of timbres is often increased by allowing modulation of the oscillator wave shape geometry, for example, by varying the width of a pulse waveform or the symmetry of a triangle wave. Additionally, timbres can be modulated using "wave shaping" wherein a lookup table or other transfer function maps one voltage contour into another. Certain details regarding wave shaping and wave tables are described at the following links: https://en.wikipedia.org/wiki/Waveshaper and https://en.wikibooks.org/wiki/Sound_Synthesis_Theory/Oscillators_and_Wavetables. Also, other techniques, such as frequency modulation, have been used to create additional timbral modulation. For example, Chowning Frequency Modulation (FM) is described at the following link: https://web.eecs.umich.edu/~fessler/course/100/misc/chowning-73-tso.pdf. Musicians are constantly seeking new methods of timbral modulation to produce musical sounds or notes having the desired unique, varying, interesting, pleasing and/or expressive timbre.

One well-known method of producing dynamic timbres is call hard synchronization (hard sync). The hard sync method is described at the following links: https://en.wikipedia.org/wiki/Oscillator_sync and https://www.keithmcmillen.com/blog/simple-synthesis-part-7-oscillator-sync/. This well-known hard sync technique uses two oscillators, the first of which (the fundamental oscillator) provides a fundamental frequency. The second oscillator (traditionally termed the output oscillator, but herein, for clarity, called the modulation oscillator) is operated at a frequency typically higher that the first, and is reset to the original point of its waveform when the first oscillator completes its cycle. The result is a waveform whose fundamental period is at the frequency of the first oscillator, but which contains many harmonics which vary in an interesting and pleasing manner as the frequency of the second oscillator is varied. Hard synchronization is a well-known and familiar timbre to music synthesists; though its use is presently limited because of its simplicity and familiarity.

Another well-known timbral modulation technique is called "ring modulation" and is described at the following links: https://en.wikipedia.org/wiki/Ring_modulation and http://synthesizeracademy.com/ring-modulator/. This technique derives its name from the fact that the analog circuit of diodes originally used to implement this technique takes the shape of a ring. Ring modulation is also called four-quadrant multiplication as it can be implemented by simply multiplying two signals, traditionally called a carrier signal and a modulator signal, together. When two sinusoids are multiplied together, for example, as can be seen by well-known trigonometric identities, the result is the sum and difference of the frequencies of the sine waves that comprise the signals. Thus, while ring modulation adds additional frequencies into the spectrum, these frequencies are not harmonically related (i.e., at fixed multiples) to the original notes and thus often are not pleasing or musically useful. Ring modulation is often associated with "science fiction" sounds rather than music, though it can be used to create some pleasing bell-like tones as well. Note that in most modern ring modulation circuits, the carrier and modulation inputs are interchangeable.

SUMMARY

This section is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

According to an example embodiment, a method for generating oscillatory timbres for musical synthesis through synchronous ring modulation is provided. An example method comprises: performing hard synchronization comprising: using a first oscillator and a second oscillator, the first oscillator being a fundamental oscillator which provides a fundamental frequency, the second oscillator being a modulation oscillator that can be operated at a frequencies higher than the first oscillator; and in response to the fundamental oscillator completing its cycle, synchronizing the modulation oscillator to the original point of its waveform. The example method further includes performing ring modulation on the synchronized output of the modulation oscillator by multiplying the synchronized output of the modulation oscillator by a waveform of the fundamental oscillator, such that the ring modulation is synchronized to produce a variety of oscillatory timbres.

Additional objects, advantages, and novel features of the examples will be set forth in part in the description which follows, and in part will become apparent to those skilled in the art upon examination of the following description and the accompanying drawings or may be learned by production or operation of the examples. The objects and advantages of the concepts may be realized and attained by means of the methodologies, instrumentalities and combinations particularly pointed out in the appended claims.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to particular embodiments illustrated herein.

FIG. 4 is a flow diagram showing a method for generating oscillatory timbres for musical synthesis through synchronous ring modulation, according to an example embodiment.

FIG. 4A is a simplified flow diagram of a method having particular real-time audio signal processing including creating a pulse train, according to another example embodiment.

DETAILED DESCRIPTION

Figure 1:
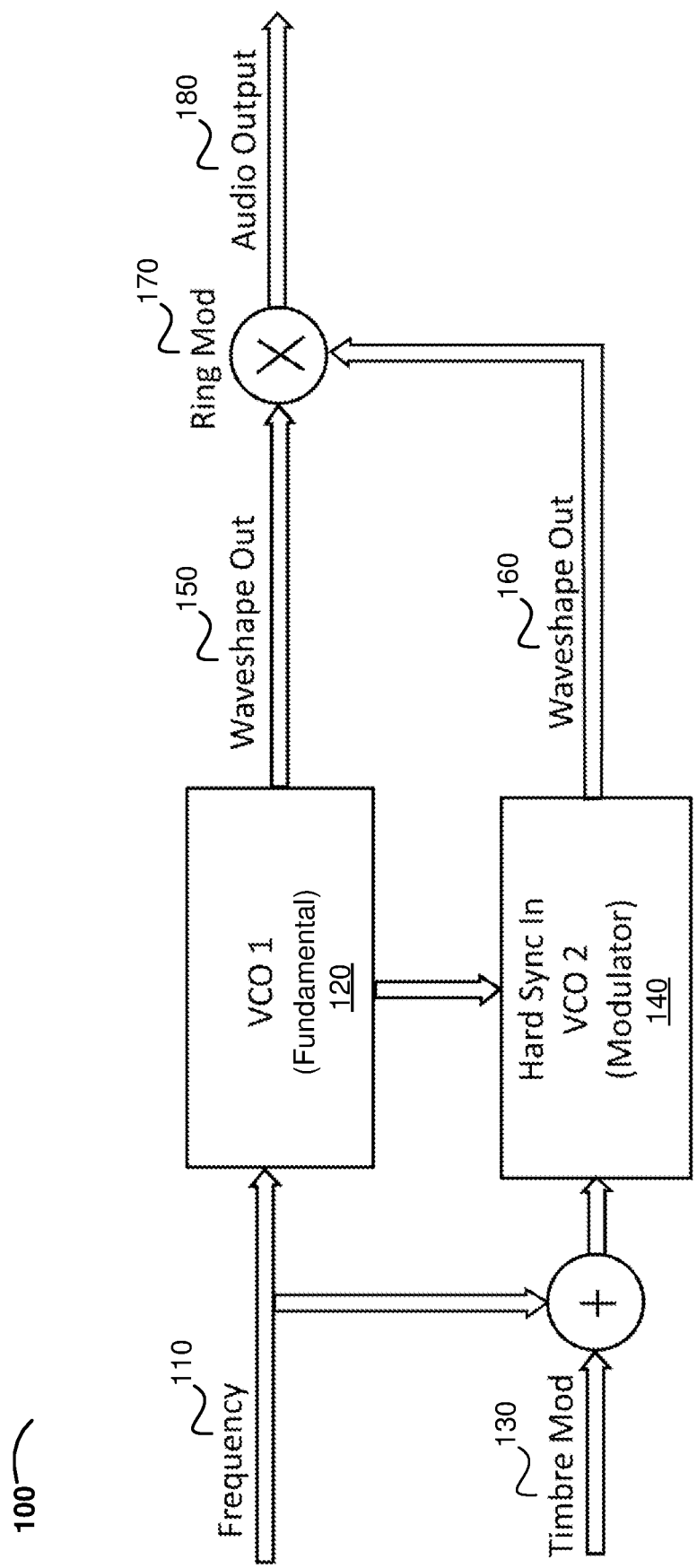
FIG. 1 illustrates an example embodiment implemented by interconnecting two voltage controlled oscillators (VCOs), one of which implements hard sync, along with a ring modulator.

The following detailed description includes references to the accompanying drawings, which form a part of the detailed description. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical and electrical changes can be made without departing from the scope of what is claimed. The following detailed description is, therefore, not to be taken in a limiting sense.

In various embodiments, the methods and systems of the present technology combines ring modulation with certain aspects of hard synchronization to create a surprisingly wide palate of musically useful oscillatory timbres. The generation of a diverse number of oscillatory timbres from this combination (and variations described herein) that are musically useful is an insight the inventor recognized but has found no others who have recognized this. This generation also meets a long felt need of musicians to create timbres that have not been heard before, while also being musically pleasing to the ear of the listener. This unique and musically useful nature of the surprisingly wide palate of oscillatory timbres that can be generated using the present technology is a Godsend to musicians longing for unique and pleasing sounds.

A variation of hard sync has been implemented by Curtis Electro-music Specialties in the CEM3340 and CEM3345 products. In this variant, rather that resetting the output oscillator to the original point of its waveform, the internal triangle waveform is reversed in slope. In some embodiments of the present technology, the Curtis hard sync variant can be used instead of the traditional hard sync approach, with varying results. The CEM3340/45 datasheet can be found online in PDF format at: https://nebula.wsimg.com/1c34939ca17fdcf07c8ceee4661ba253?AccessKeyId=E68C2B1C2930EF53D3A4.

In one example embodiment of the present technology, a waveform of a hard synchronized oscillator pair's modulation oscillator is multiplied (e.g., ring modulated with) a waveform of the fundamental oscillator. Because the modulating oscillator is synchronized, the disadvantage of ring modulation—the lack of harmonic relationship of the frequencies added—is eliminated.

It should be noted that ring modulation, which can be viewed as simply multiplication of two signals, is the simplest example of a plethora of signal modulation techniques involving multiplication wherein two or more audio signals are cross-modulated resulting, when synchronization is not performed, in audibly objectionable sum and difference frequencies. One skilled in the art will recognize that the techniques herein described are applicable not only to ring modulation, but to any form of audio cross-modulation where it is desirable to provide such timbral modulation while suppressing the sum and difference frequencies and forcing the result to be purely periodic with the fundamental oscillator's frequency. When ring modulation is referenced herein, it should be clear that all other applicable forms of cross-modulation are implied.

A variety of parameters can be used to dynamically or statically vary the timbres produced. The depth of ring modulation can be dynamically varied. The frequency of the synchronized oscillator can be varied. The waveshape of either oscillator can be varied. The phase relationship of the synchronization can be varied. Additional modulation oscillators, each with its own dynamically varying frequency, waveshape, phase, and modulation depth can perform additional ring modulation. Each of these variations has its own unique timbral consequence, and the interaction among variations can be complex.

In addition to modulating the fundamental oscillator of a hard synchronized oscillator pair, it can be practical to synchronize a modulation oscillator with an existing audio signal with some degree of detectable periodicity, and ring modulate that signal with the synchronized modulation oscillator's output, to vary the timbre of an existing periodic signal of arbitrary complexity.

Analog Oscillator

Some embodiments of the present technology can be simply implemented by interconnecting two voltage controlled oscillators (VCOs), one of which implements hard sync, along with a ring modulator. FIG. 1 illustrates an example embodiment 100 of this implementation. In some implementations, the fundamental frequency of the note is determined by the Frequency control voltage (CV) input ("Frequency" identified at 110 in FIG. 1), which controls the frequency of voltage controlled oscillator VCO 1 (Fundamental) also identified as 120. An additional control voltage that varies the timbre modulation of the note ("Timbre Mod" also identified at 130 in FIG. 1) can be added to the frequency CV 110 to control the frequency of voltage controlled oscillator VCO 2 also identified as 140, which is also hard sync'd to VCO 1 (120). In the example in FIG. 1, the selected waveshapes ("Waveshape Out") 150 and 160 respectively of each of the two VCOs are multiplied by the Ring Modulator ("Ring Mod" identified as 170) to produce an audio output 180 whose timbre will depend on the selected waveshapes (150 and 160) and the relative frequencies (as dynamically varied by the Timbre Modulation 130) of the two VCOs 120 and 140.

Although particular waveshapes are included in the description, other suitable waveshapes may be used to practice the present technology, including, but not limited to, user created waveshapes.

Figure 1A:
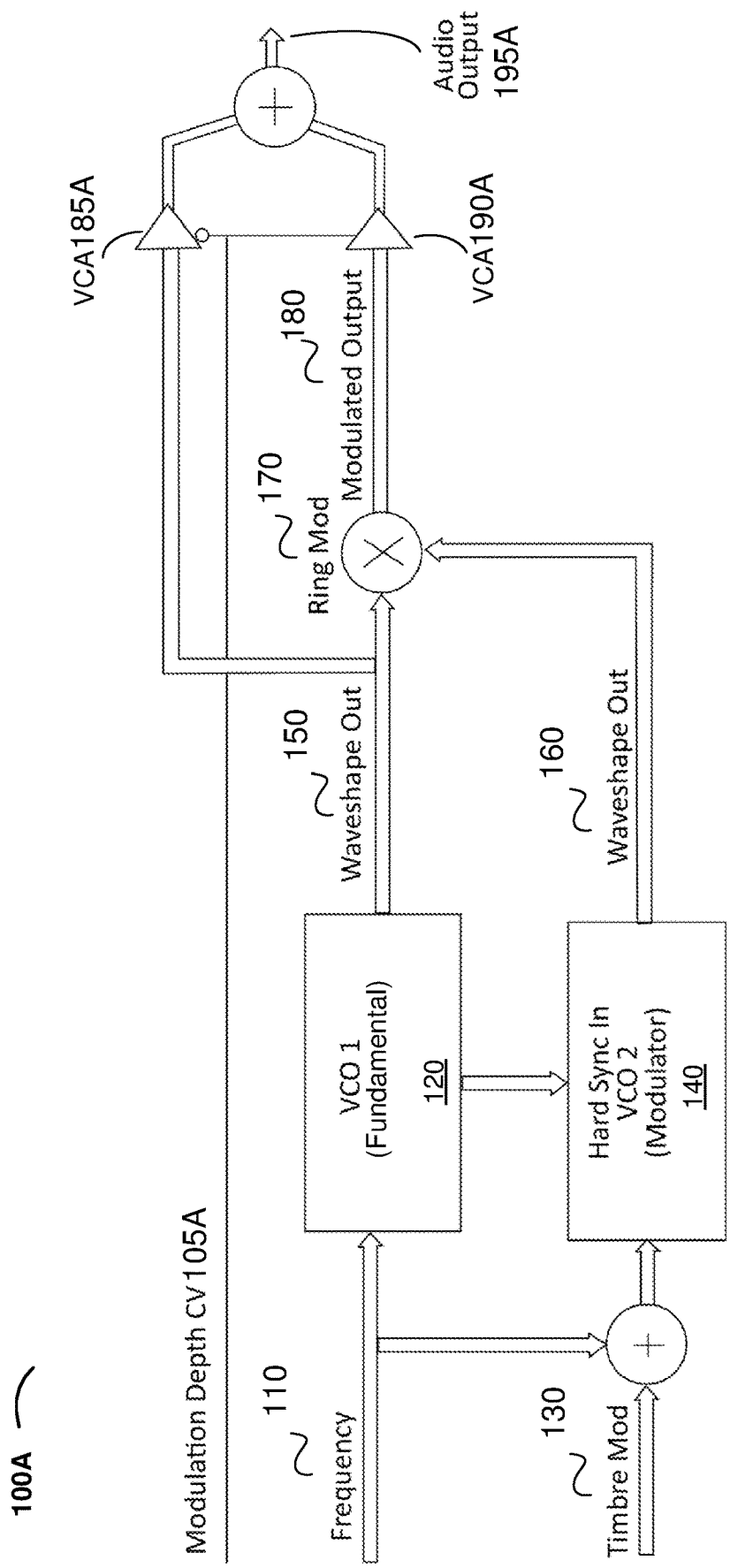
FIG. 1A illustrates an example analog embodiment which adds the ability to control the depth of the modulation effect.

FIG. 1A illustrates another example embodiment 100A of this implementation. This example embodiment is similar to that shown in FIG. 1 with the addition of a Modulation Depth Control Voltage (CV) 105A which varies the amount of modulation that is applied to the waveshape out from zero to 100%. In the example in FIG. 1A the result of the ring mod 170 multiplication is identified as modulated output 180, the two VCAs controlled by the modulation depth CV 105A are identified as 185A and 190A, and the resultant audio output is identified as 195A. One skilled in the art will observe that there are numerous alternative arrangements of multipliers, adders, and VCAs that can be arranged to implement the same effect, according to various embodiments.

Figure 2:
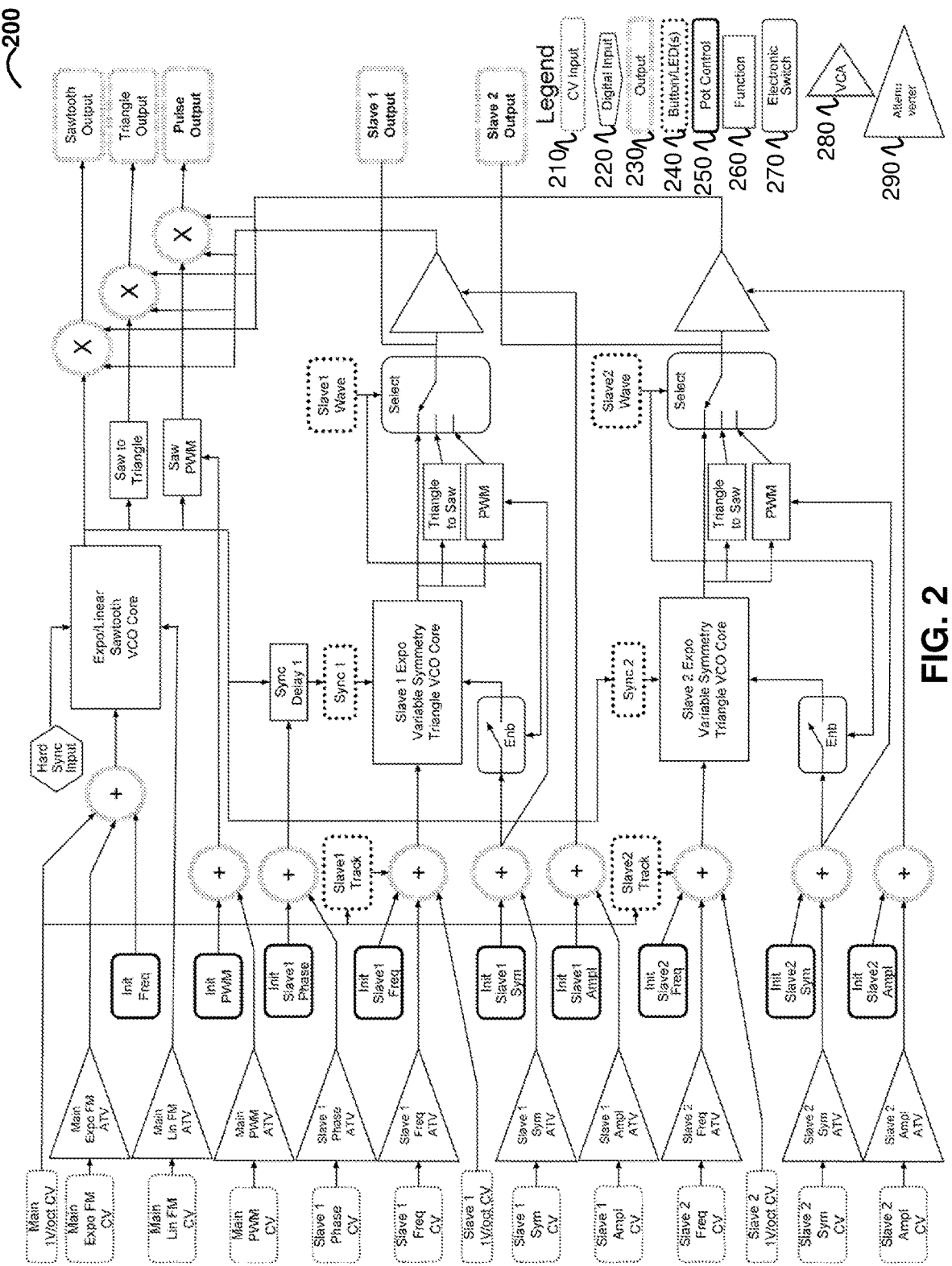
FIG. 2 illustrates an example analog embodiment which adds additional timbral capabilities.

A preferred analog embodiment adds additional timbral capabilities. An example of the preferred analog embodiment in shown in the example diagram 200 in FIG. 2. In this example, two modulation oscillators (Slave 1 and Slave 2) are available and both can be used by simply performing two stages of ring modulation, which implies two multipliers. Also of particular note is that dynamic variation of the waveforms, such as the width of a pulse waveform ("PWM") or the symmetry of a triangle waveform, will produce interesting variations in the ultimate timbre. Also, controlling the amplitude of the modulation provides the depth of modulation control equivalent to FIG. 1A. In the example in FIG. 2, voltage controlled amplifiers (VCAs) can be used for controlling amplitude. In some embodiments, adding a time varying delay in the hard synchronization ("Sync delay" in FIG. 2), in this case called the "phase", provides yet another valuable timbral modulation. In FIG. 2 for the various elements in some embodiments, the CV input stages are identified at 210, the digital input stages are identified at 220, the output stages are identified at 230, button/LED(s) are identified at 240; pot control is identified at 250, function is identified at 260 and electronic switches are identified at 270. VCA stages are identified at 280 and attenuverter at 290.

Digital Oscillator

In various embodiments, the digital implementation of voltage controlled oscillators, and in particular of hard sync, requires anti-aliasing to prevent digital aliases from degrading the audio. There are many known methods to implement this anti-aliasing as described for example at the following link: https://www.cs.cmu.eduheli/papers/icmc01-hardsync.pdf. Ring modulation can be digitally implemented as an anti-aliased signal multiplication. In addition, various embodiments can benefit from any unique digital signal processing performed on any oscillator waveshape prior to ring modulation.

Modulator—Mixed

Figure 3:
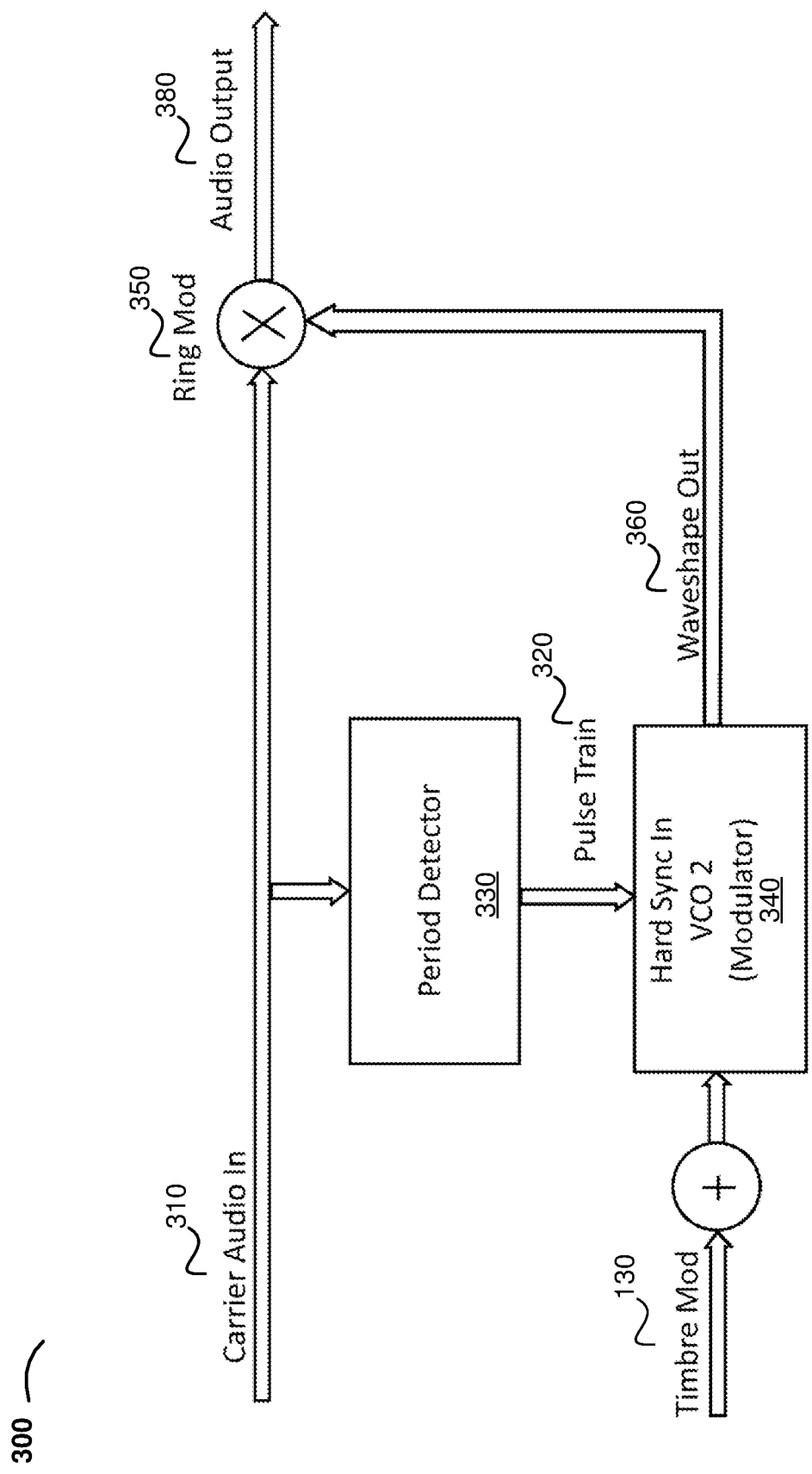
FIG. 3 illustrates an example embodiment of a mixed modulator for altering the timbre of an existing audio signal.

In addition to using a voltage controlled oscillator as the source of the "Carrier" audio input to the ring modulator, it can be practical to alter the timbre of an existing audio signal, according to some embodiments. FIG. 3 is a diagram illustrating an example embodiment 300 of the mixed modulator having an audio output 380. The existing audio signal ("carrier audio in" that is identified at 310) could be an analog signal, a real-time digital audio signal, or a digital "sample" such as a recording of a traditional instrument note, or any other audio source that contains some detectable nominally periodic element ("periodicity"). In some embodiments, a pulse train 320 must be created that is periodic and synchronous (see period detector 330) with such (audio source "carrier audio in" 310) periodic elements; the pulse train is then used as the hard sync input to the modulation oscillator 340.

The pulse train can be created either in real-time or using off-line processing. If off-line processing is used, the pulse train thus created is played back synchronously with the processed carrier sample, according to some embodiments. Using off-line processing, a wide variety of signal processing techniques can be used, up to and including hand editing of the pulse train.

If the pulse train is to be created in real-time in some embodiments, the pulse train must be created with low latency, and be responsive to both slow and rapid changes in any periodicity in the carrier signal. Digital signal processing techniques, typically a combination of zero-crossing, autocorrelation, and fast fourier transform (FFT) methods may be used. Example autocorrelation and pitch detection methods are described at the following link: https://sound.eti.pg.gda.pl/student/eim/synteza/leszczyna/index_ang.htm.

In mixed signal implementations, the modulation VCO ("modulator" identified as 340 in FIG. 3) and ring modulation 350 in various embodiments are performed in the analog domain, eliminating any requirement for anti-aliasing the VCO or the multiplication result.

The inventor has found that the audible effect remains remarkably pleasing despite inaccuracies in the creation of the pulse train, or regions with little or no periodicity in the carrier.

All of the additional timbral capabilities previously described are applicable to this embodiment as well. In particular, dynamically varying the modulation depth, dynamically varying the waveshape out 360 of the modulation oscillator, and adding a variable delay or phase modulation to the pulse train are all useful.

Modulator—all Digital

In other embodiments, the VCO and/or the ring modulation can be performed in the digital domain, using any appropriate anti-aliasing method.

The timbre modulation methods disclosed for the oscillator in the above embodiments are applicable to the mixed signal and all digital modulator implementations in various embodiments. In particular, adding a variable delay to the pulse train to change the phase of the modulation is particularly useful, according to various embodiments.

It is noted that the above examples all produce a monophonic note. Using techniques well-known to those skilled in the art, example embodiments described herein can be adapted for providing multiple channels of the analog implementation. Having multiple channels can create polyphonic instruments, which can play many notes at once, typically controlled by a musical keyboard. Also note that when implemented using digital techniques, polyphonic instruments can be created by multiple CPUs, multiple threads, or other time domain multiplexing techniques well-known to those skilled in the art.

FIG. 4 is a simplified flow diagram (flow chart) of a method 400, according to an example embodiment.

Operation 405 includes performing hard synchronization comprising: using a first oscillator and a second oscillator, the first oscillator being a fundamental oscillator which provides a fundamental frequency; the second oscillator being a modulation oscillator that can be operated at a frequencies higher than the first oscillator, as described further herein.

In the example in FIG. 4, performing hard synchronization further comprises at operation 410, in response to the fundamental oscillator completing its cycle, synchronizing the modulation oscillator to the original point of its waveform, as described further herein.

Operation 415 in the example in FIG. 4 includes performing ring modulation on the synchronized output of the modulation oscillator by multiplying the synchronized output of the modulation oscillator by a waveform of the fundamental oscillator, such that the ring modulation is synchronized to produce a variety of oscillatory timbres, as described further herein.

FIG. 4A is a simplified flow diagram (flow chart) of a method 400A, according to an example embodiment.

Operation 405A includes receiving an input signal having a degree of detectable periodicity.

Operation 410A in the example in FIG. 4A includes creating a pulse train that is periodic with periodic elements of the received audio signal. The pulse train is created in real-time in some embodiments. In other embodiments, the pulse train is created using off-line processing.

Operation 415A includes using the pulse train as a hard synchronization input to a modulation oscillator to produce a synchronized modulation oscillator output.

Operation 420A in the example in FIG. 4A includes performing ring modulation on the synchronized modulation oscillator output by multiplying the synchronized modulation oscillator output by the received audio signal, such that the ring modulation is synchronized to produce a plurality of different oscillatory timbres such that unique sounds having musically pleasing characteristics are created.

Figure 5:
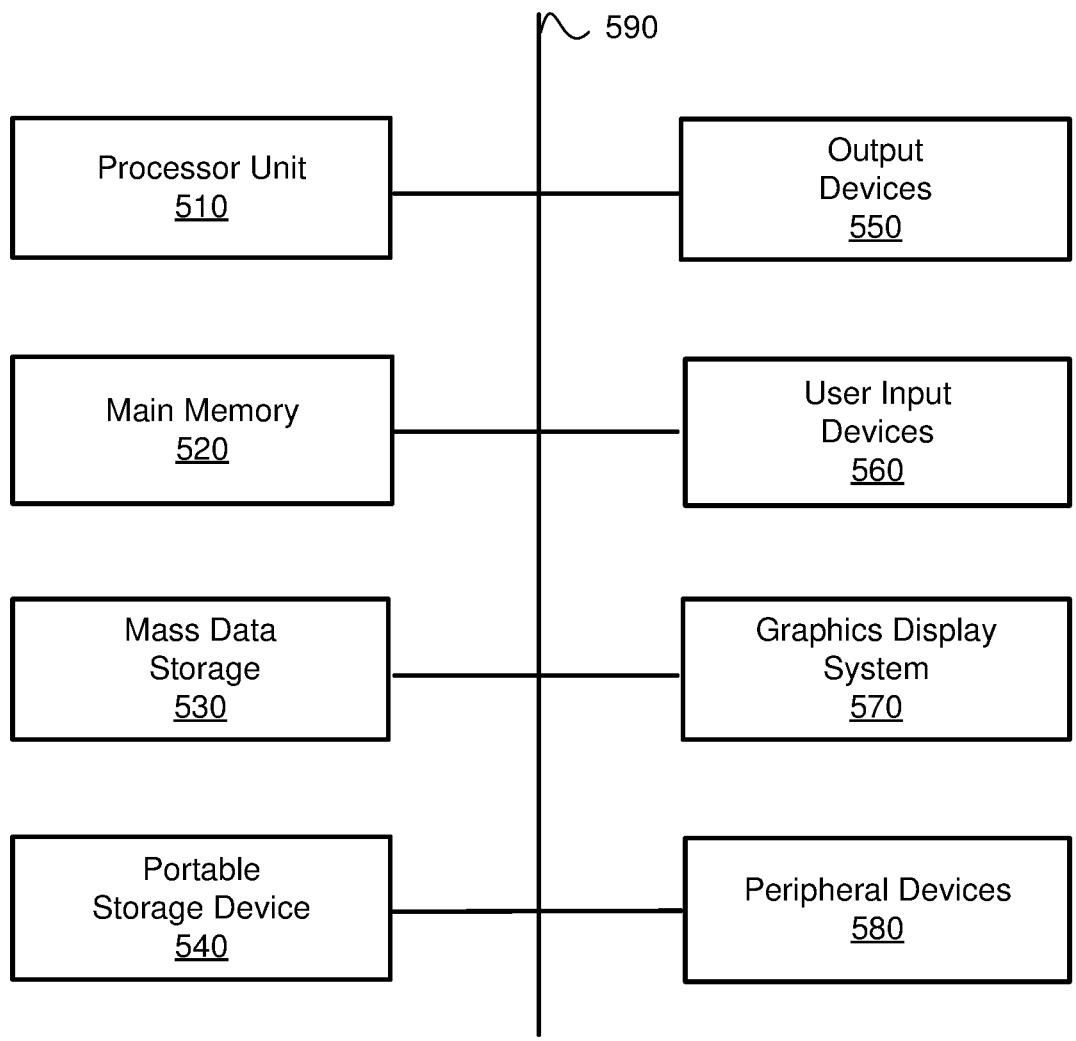
FIG. 5 is a schematic diagram of a computing system that is used to implement embodiments according to the present technology.

FIG. 5 illustrates an exemplary computer system 500 that may be used to implement various source devices according to various embodiments of the present disclosure. The computer system 500 of FIG. 5 may be implemented in the contexts of the likes of computing systems, networks, servers, or combinations thereof. The computer system 500 of FIG. 5 includes one or more processor unit(s) 510 and main memory 520. Main memory 520 stores, in part, instructions and data for execution by processor unit(s) 510. Main memory 520 stores the executable code when in operation, in this example. The computer system 500 of FIG. 5 further includes a mass data storage 530, portable storage device 540, output devices 550, user input devices 560, a graphics display system 570, and peripheral devices 580.

The components shown in FIG. 5 are depicted as being connected via a single bus 590. The components may be connected through one or more data transport means. Processor unit(s) 510 and main memory 520 are connected via a local microprocessor bus, and the mass data storage 530, peripheral devices 580, portable storage device 540, and graphics display system 570 are connected via one or more input/output (I/O) buses.

Mass data storage 530, which can be implemented with a magnetic disk drive, solid state drive, or an optical disk drive, is a non-volatile storage device for storing data and instructions for use by processor unit(s) 510. Mass data storage 530 stores the system software for implementing embodiments of the present disclosure for purposes of loading software into main memory 520.

Portable storage device 540 operates in conjunction with a portable non-volatile storage mediums (such as a flash drive, compact disk, digital video disc, or USB storage device, to name a few) to input and output data/code to and from the computer system 500 of FIG. 5. The system software for implementing embodiments of the present disclosure is stored on such a portable medium and input to the computer system 500 via the portable storage device 540.

User input devices 560 can provide a portion of a user interface. User input devices 560 may include one or more microphones; an alphanumeric keypad, such as a keyboard, for inputting alphanumeric and other information; or a pointing device, such as a mouse, a trackball, stylus, or cursor direction keys, or a musical instrument keyboard. User input devices 560 can also include a touchscreen, or other interfaces to sense musical gestures such as pedals, wheels, or touch sensors within a keyboard. Additionally, the computer system 500 as shown in FIG. 5 includes output devices 550. Suitable output devices 550 include speakers, printers, network interfaces, and monitors.

Graphics display system 570 include a liquid crystal display (LCD) or other suitable display device. Graphics display system 570 is configurable to receive textual and graphical information and process the information for output to the display device. Peripheral devices 580 may include any type of computer support device to add additional functionality to the computer, including MIDI (Musical Instrument Digital Interface) interfaces.

The components provided in the computer system 500 of FIG. 5 are those typically found in computer systems that may be suitable for use with embodiments of the present disclosure and are intended to represent a broad category of such computer components that are well known in the art. Thus, the computer system 500 of FIG. 5 can be a personal computer (PC), hand held computer system, telephone, mobile computer system, workstation, tablet, phablet, mobile phone, server, minicomputer, mainframe computer, wearable, computer controlled musical instrument, or any other computer system. The computer may also include different bus configurations, networked platforms, multi-processor platforms, and the like. Various operating systems may be used including UNIX, LINUX, WINDOWS, MAC OS, ANDROID, IOS, CHROME, TIZEN and other suitable operating systems.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accord with the technology. Those skilled in the art are familiar with instructions, processor(s), and storage media.

The processing for various embodiments may be implemented in software that is cloud-based. The computer system 500 may be implemented as a cloud-based computing environment. In other embodiments, the computer system 500 may itself include a cloud-based computing environment. Thus, the computer system 500, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices.

The cloud may be formed, for example, by a network of web servers that comprise a plurality of computing devices, such as the computer system 500, with each server (or at least a plurality thereof) providing processor and/or storage resources. These servers may manage workloads provided by multiple users (e.g., cloud resource customers or other users).

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, nonvolatile media, volatile media and transmission media. Nonvolatile media include, e.g., optical, magnetic, and solid-state disks, such as a fixed disk. Volatile media include dynamic memory, such as system random-access memory (RAM). Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications. Common forms of computer-readable media include, e.g., a floppy disk, a flexible disk, a hard disk, magnetic tape, any other magnetic medium, a CD-ROM disk, digital video disk (DVD), any other optical medium, any other physical medium with patterns of marks or holes, a RAM, a programmable read-only memory (PROM), an erasable programmable read-only memory (EPROM), an electrically erasable programmable read-only memory (EEPROM), a Flash memory, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology may be written in any combination of one or more programming languages, including an object oriented programming language such as JAVASCRIPT, JAVA, SMALLTALK, C++ or the like and conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (e.g., through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

Aspects of the present technology are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present technology. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected", "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purpose only, and are not drawn to scale.

While specific embodiments of, and examples for, the system are described above for illustrative purposes, various equivalent modifications are possible within the scope of the system, as those skilled in the relevant art will recognize. For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways. Also, while processes or steps are at times shown as being performed in series, these processes or steps may instead be performed in parallel, or may be performed at different times.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method for generating oscillatory timbres for musical synthesis through synchronous ring modulation, the method comprising:
   performing hard synchronization comprising:
      using a first oscillator and a second oscillator, the first oscillator being a fundamental oscillator which provides a fundamental frequency, the second oscillator being a modulation oscillator that can be operated at frequencies higher than the first oscillator; and
      in response to the fundamental oscillator completing its cycle, synchronizing the modulation oscillator to an original point of its waveform to produce a synchronized output; and
   performing ring modulation on the synchronized output of the modulation oscillator by multiplying the synchronized output of the modulation oscillator by a waveform of the fundamental oscillator, such that the ring modulation is synchronized to produce a plurality of different oscillatory timbres.

2. The method of claim 1, wherein the first and second oscillators are voltage controlled oscillators.

3. The method of claim 2, wherein the fundamental frequency is determined by a frequency control voltage (CV) received at an input of the first voltage controlled oscillator.

4. The method of claim 3, the synchronizing including:
   having a frequency control voltage for varying timbre modulation being added to the frequency control voltage received at the input of the first voltage controlled oscillator to control the frequency of the second voltage controlled oscillator, and
   hard synchronizing the second voltage controlled oscillator to the first voltage controlled oscillator.

5. The method of claim 4, wherein a particular timbre of a variety of timbres resulting from the ring modulation is a function of:
   selected waveshapes output from the first and second voltage controlled oscillators, and
   relative frequencies of the first and second voltage controlled oscillators resulting from the varying of the timbre modulation.

6. The method of claim 2, wherein modulation depth is varied based on a control voltage (CV) input.

7. The method of claim 6, wherein the plurality of different oscillatory timbres is configurable to be further varied by varying a frequency of the synchronized modulation oscillator.

8. The method of claim 6, wherein the plurality of different oscillatory timbres is configurable to be further varied based on having a selected waveshape being dynamically varied for the first oscillator and/or the second oscillator.

9. The method of claim 6, wherein the plurality of different oscillatory timbres is configurable to be further varied based on varying a phase relationship of the synchronizing.

10. The method of claim 6, further comprising additional ring modulation performed by additional modulation oscillators, each of the additional modulation oscillators having a different dynamically varying frequency, waveshape, phase, and/or modulation depth.

11. The method of claim 4, further comprising generating another plurality of different oscillatory timbres by:
having another modulation oscillator; and
performing ring modulation on a synchronized output of the another modulation oscillator by multiplying the synchronized output of the another modulation oscillator by a waveform of the fundamental oscillator, such that two stages of ring modulation are performed.

12. The method of claim 11, further comprising dynamically varying the waveform of each of the modulation oscillators to produce further variations of the plurality of different oscillatory timbres using one or more of pulse width modulation and triangle symmetry modulation.

13. The method of claim 12, further comprising controlling amplitude of one or more control voltage inputs using one or more voltage controller amplifiers for controlling amplitude of the modulation to produce a further plurality of different oscillatory timbres.

14. The method of claim 13, further comprising adding a time varying delay for performing the hard synchronization to provide other oscillatory timbres.

15. The method of claim 6, wherein the first and second voltage controlled oscillators and ring modulation are digitally implemented, the method further comprising anti-aliasing to prevent digital aliases from degrading the output.

16. A system for generating oscillatory timbres for musical synthesis through synchronous ring modulation, the system comprising:
a first oscillator and a second oscillator, the first oscillator being a fundamental oscillator which provides a fundamental frequency, the second oscillator being a modulation oscillator that can be operated at frequencies higher than the first oscillator;
the first oscillator being coupled to and hard synchronized to the second oscillator, the hard synchronizing comprising in response to the first oscillator completing its cycle, synchronizing the second oscillator to an original point of its waveform to produce a synchronized output;
a multiplier for multiplying the synchronized output of the modulation oscillator by a waveform of the fundamental oscillator so as to perform ring modulation on the synchronized output of the modulation oscillator to produce a plurality of different oscillatory timbres; and
control signals for varying a depth of modulation and at least one other parameter.

17. A method for generating oscillatory timbres for musical synthesis through synchronous ring modulation, the method comprising:
receiving an audio signal having some degree of detectable periodicity;
creating a pulse train having some degree of detectable periodicity based on the audio signal;
using the pulse train as a hard synchronization input to a modulation oscillator to produce a synchronized output; and
performing ring modulation on the synchronized output of the modulation oscillator by multiplying the synchronized output of the modulation oscillator by the audio signal, such that the ring modulation is synchronized to produce a plurality of different oscillatory timbres.

18. The method of claim 17, further including dynamically varying a depth of modulation.

19. The method of claim 17, wherein the pulse train is created in real-time.

20. The method of claim 19, wherein the pulse train is created using zero-crossing detection.

21. The method of claim 19, wherein the pulse train is created using autocorrelation.

22. The method of claim 17, wherein the audio signal is based on a pre-recorded musical segment and the pulse train is computed using off-line processing.

23. The method of claim 17, wherein the ring modulation is implemented in an analog domain.

24. The method of claim 17, wherein the modulation oscillator is implemented in an analog domain.

* * * * *